(12) United States Patent
Hong et al.

(10) Patent No.: US 12,225,774 B2
(45) Date of Patent: Feb. 11, 2025

(54) DISPLAY DEVICE AND METHOD OF MANUFACTURING THE SAME

(71) Applicant: SAMSUNG DISPLAY CO., LTD., Yongin-si (KR)

(72) Inventors: Pilsoon Hong, Yongin-si (KR); Jungi Kim, Yongin-si (KR); Junho Sim, Yongin-si (KR); Jaehun Lee, Yongin-si (KR); Yangho Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 484 days.

(21) Appl. No.: 17/353,815

(22) Filed: Jun. 22, 2021

(65) Prior Publication Data

US 2022/0181409 A1 Jun. 9, 2022

(30) Foreign Application Priority Data

Dec. 4, 2020 (KR) .................. 10-2020-0168715

(51) Int. Cl.
*H10K 59/122* (2023.01)
*H10K 50/844* (2023.01)
*H10K 50/86* (2023.01)
*H10K 71/00* (2023.01)

(52) U.S. Cl.
CPC ......... *H10K 59/122* (2023.02); *H10K 50/844* (2023.02); *H10K 50/865* (2023.02); *H10K 71/00* (2023.02)

(58) Field of Classification Search
CPC .... H10K 59/122; H10K 50/865; H10K 71/00; H10K 50/8428; H10K 50/86; H10K 50/8426; H10K 59/38; H10K 59/1201
See application file for complete search history.

(56) References Cited

U.S. PATENT DOCUMENTS

| | | | |
|---|---|---|---|
| 9,859,528 B2 | 1/2018 | Noda et al. | |
| 10,950,673 B2 | 3/2021 | Bae et al. | |
| 11,183,553 B2 | 11/2021 | Woo et al. | |
| 2016/0260785 A1* | 9/2016 | Jiao | H10K 59/122 |
| 2018/0261797 A1* | 9/2018 | Lee | H10K 59/8723 |
| 2020/0012191 A1 | 1/2020 | Kamemoto et al. | |
| 2020/0091251 A1* | 3/2020 | Hu | H10K 71/135 |
| 2020/0328263 A1* | 10/2020 | Choi | H10K 50/818 |
| 2021/0066643 A1* | 3/2021 | Choi | H10K 50/822 |
| 2021/0091151 A1* | 3/2021 | Lee | H10K 59/122 |
| 2021/0111232 A1 | 4/2021 | Park et al. | |
| 2022/0158136 A1* | 5/2022 | Yang | H10K 71/00 |

FOREIGN PATENT DOCUMENTS

| | | |
|---|---|---|
| EP | 3806159 | 4/2021 |
| KR | 10-2018-0025466 | 3/2018 |
| KR | 10-2018-0035512 | 4/2018 |

(Continued)

*Primary Examiner* — Shaun M Campbell
(74) *Attorney, Agent, or Firm* — KILE PARK REED & HOUTTEMAN PLLC

(57) ABSTRACT

A display device includes a substrate, a first electrode disposed on the substrate, a first pixel-defining layer disposed on the first electrode, the first pixel-defining layer having a first opening exposing at least a portion of the first electrode and including a pigment, and a second pixel-defining layer disposed on the first pixel-defining layer and including a dye.

15 Claims, 17 Drawing Sheets

(56) References Cited

FOREIGN PATENT DOCUMENTS

| KR | 10-2019-0096470 | 8/2019 |
| KR | 10-2019-0125983 | 11/2019 |
| KR | 10-2019-0130705 | 11/2019 |
| KR | 10-2020-0119946 | 10/2020 |
| KR | 10-2021-0043792 | 4/2021 |

* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2020-0168715, filed on Dec. 4, 2020, which is hereby incorporated by reference for all purposes as if fully set forth herein.

BACKGROUND

Field

Embodiments of the invention relate generally to a display device and a method of manufacturing the display device, and more specifically, to a display device with a layer for preventing or reducing reflection of external light, and a method of manufacturing the display device.

Discussion of the Background

As a display device that displays an image, an organic light-emitting diode display device has a self-emission characteristic unlike a liquid crystal display device. Therefore, as the organic light-emitting diode display device does not require a separate light source, the thickness and the weight of the organic light-emitting diode display device may be reduced. In addition, the organic light-emitting diode display device may have high quality characteristics such as low power consumption, high luminance, and high reaction speed.

The above information disclosed in this Background section is only for understanding of the background of the inventive concepts, and, therefore, it may contain information that does not constitute prior art.

SUMMARY

Applicant realized that an organic light-emitting diode display device should have good contrast and luminance, but when external light is bright, the contrast may be poor. In order to prevent this, a pixel-defining layer having a certain color (e.g., black, etc.) may be formed. However, there is a problem that dark spots occur due to residue generated in a process of forming the pixel-defining layer having a certain color.

Display devices constructed according to the principles of the principles are capable of solving various problems including the above problem. For example, the display devices are capable of preventing or reducing a decrease in characteristics due to external light and defects due to occurrence of dark spots.

In addition, methods of manufacturing the display devices according to the principles of the invention can prevent or reduce a decrease in characteristics due to external light and defects due to occurrence of dark spots.

Additional features of the inventive concepts will be set forth in the description which follows, and in part will be apparent from the description, or may be learned by practice of the inventive concepts.

According to one or more embodiments, a display device includes a substrate, a first electrode disposed on the substrate, a first pixel-defining layer disposed on the first electrode, the first pixel-defining layer having a first opening exposing at least a portion of the first electrode and including a pigment, and a second pixel-defining layer first pixel-defining layer on the first pixel-defining layer and including a dye.

The first pixel-defining layer may have an optical density of about 1 or more.

An optical density of the first pixel-defining layer may be substantially equal to or greater than an optical density of the second pixel-defining layer.

The first pixel-defining layer may include a plurality of particles, and an average size of the plurality of particles may be about 200 nm or less.

The second pixel-defining layer may have a second opening exposing at least a portion of the first electrode.

A width of the first opening may be greater than a width of the second opening.

The second pixel-defining layer may cover an upper surface and a side surface of the first pixel-defining layer.

The second pixel-defining layer may be in direct contact with the first electrode.

The first pixel-defining layer may include a negative photosensitive material, and the second pixel-defining layer may include a positive photosensitive material.

Each of the first pixel-defining layer and the second pixel-defining layer may include a negative photosensitive material.

Each of the first pixel-defining layer and the second pixel-defining layer may include a positive photosensitive material.

The first pixel-defining layer may include a positive photosensitive material, and the second pixel-defining layer may include a negative photosensitive material.

The display device may further include a spacer disposed on the second pixel-defining layer, wherein the spacer may include the same material as the second pixel-defining layer.

The first pixel-defining layer and the spacer may be formed of different materials.

The display device may further include an intermediate layer including an emission layer filling the second opening, and a second electrode disposed on the intermediate layer.

The display device may further include a thin-film encapsulation layer disposed on the second electrode and including at least one inorganic layer and at least one organic layer.

The display device may further include an optical functional layer disposed on the thin-film encapsulation layer, the optical function layer including a color filter at least partially overlapping the first opening and a black matrix surrounding the color filter.

The black matrix may at least partially overlap the first pixel-defining layer.

The black matrix may at least partially overlap the second pixel-defining layer.

According to one or more embodiments, a method of manufacturing a display device includes the steps of: forming, on a first electrode, a first colored material layer including a pigment, exposing, to light, a portion of the first colored material layer, developing the first colored material layer, which is exposed to light, to form a first pixel-defining layer having a first opening exposing at least a portion of the first electrode, forming a second colored material layer on the first electrode and the first pixel-defining layer, the second colored material layer including a dye, exposing, to light, a portion of the second colored material layer, and developing the portion of the second colored material layer, which is exposed to light, to form a second pixel-defining layer having a second opening exposing at least a portion of the first electrode.

In the step of developing the portion of the second colored material layer, which is exposed to light, to form the second pixel-defining layer, a spacer may be formed on the second pixel-defining layer, the spacer integrally formed with the second pixel-defining layer.

The first pixel-defining layer may include a negative photosensitive material, and the second pixel-defining layer may include a positive photosensitive material.

An optical density of the first pixel-defining layer may be substantially equal to or greater than an optical density of the second pixel-defining layer.

The first opening and the second opening may at least partially overlap each other.

A width of the first opening may be greater than a width of the second opening.

The second pixel-defining layer may cover an upper surface and a side surface of the first pixel-defining layer.

The second pixel-defining layer may directly contact the first electrode.

Each of the first pixel-defining layer and the second pixel-defining layer may include a negative photosensitive material.

Each of the first pixel-defining layer and the second pixel-defining layer may include a positive photosensitive material.

The first pixel-defining layer may include a positive photosensitive material, and the second pixel-defining layer may include a negative photosensitive material.

According to one or more embodiments, a display device includes: a plurality of pixels, each pixel including a pixel electrode; and a pixel-defining layer disposed between the plurality of pixels to define the plurality of pixels, wherein the pixel-defining layer includes: a first pixel-defining layer disposed to at least partially cover the pixel electrode and including a first colored material that is insoluble in liquid; and a second pixel-defining layer disposed on the first pixel-defining layer to at least partially cover the pixel electrode and including a second colored material that is soluble in liquid.

A light transmittance of the first pixel-defining layer may be substantially equal to or less than a light transmittance of the second pixel-defining layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
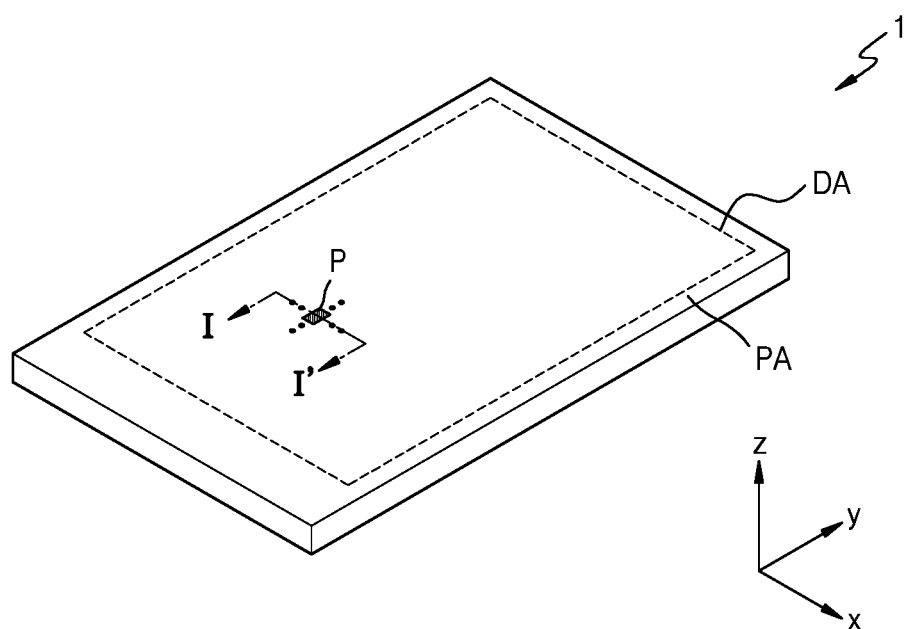
FIG. 1 is a perspective view of an embodiments of a display device constructed according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the disclosure will be described in detail with reference to the accompanying drawings, and when description is made with reference to the drawings, same reference numerals are used for the same or corresponding elements and repeated description thereof is omitted.

FIG. 1 is a schematic perspective view of a display device 1 according to an embodiment.

Referring to FIG. 1, the display device 1 may include a display area DA and a peripheral area PA arranged around the display area DA. The peripheral area PA may at least partially surround the display area DA. The display device 1 may display an image by using light emitted from pixels P arranged in the display area DA, and the peripheral area PA may be a non-display area where no image is displayed.

Hereinafter, although an organic light-emitting diode display device is described as an example of the display device 1, embodiments are not limited thereto. For example, the display device 1 may be a display device such as an inorganic light-emitting diode display device or a quantum dot light-emitting diode display device. For example, an emission layer of a display element included in the display device 1 may be formed of an organic material, an inorganic material, quantum dots, both an organic material and quantum dots, or both an inorganic material and quantum dots.

Although FIG. 1 illustrates the display device 1 having a flat display surface, embodiments are not limited thereto. In an embodiment, the display device 1 may include a three-dimensional display surface or a curved display surface.

When the display device 1 includes a three-dimensional display surface, the display device 1 may include a plurality of display areas facing different directions and may include, for example, a polygonal columnar display surface. In an embodiment, when the display device 1 includes a curved display surface, the display device 1 may be implemented in various forms such as flexible, foldable, and rollable display devices.

FIG. 1 illustrates the display device 1, which is applied to a mobile phone terminal. For example, a mobile phone terminal may be constructed by arranging an electronic module, a camera module, a power module, and the like, which are mounted on a main board, together with the display device 1 in a bracket/case or the like. For example, the display device 1 may be applied to large electronic apparatuses such as televisions or monitors and small and medium electronic apparatuses such as tablets, car navigations, game machines, or smart watches.

Although FIG. 1 illustrates a case where the display area DA of the display device 1 is tetragonal, embodiments are not limited thereto. For example, the shape of the display area DA may also be circular, elliptical, or polygonal such as triangular or pentagonal.

The display device 1 may include pixels P arranged in the display area DA. Each of the pixels P may include a display element or a light-emitting element, such as an organic light-emitting diode. Each of the pixels P may emit, for example, red light, green light, blue light, or white light through the organic light-emitting diode. The pixel P used herein will be understood as a pixel that emits one of red light, green light, blue light, and white light, as described above.

Figure 2:
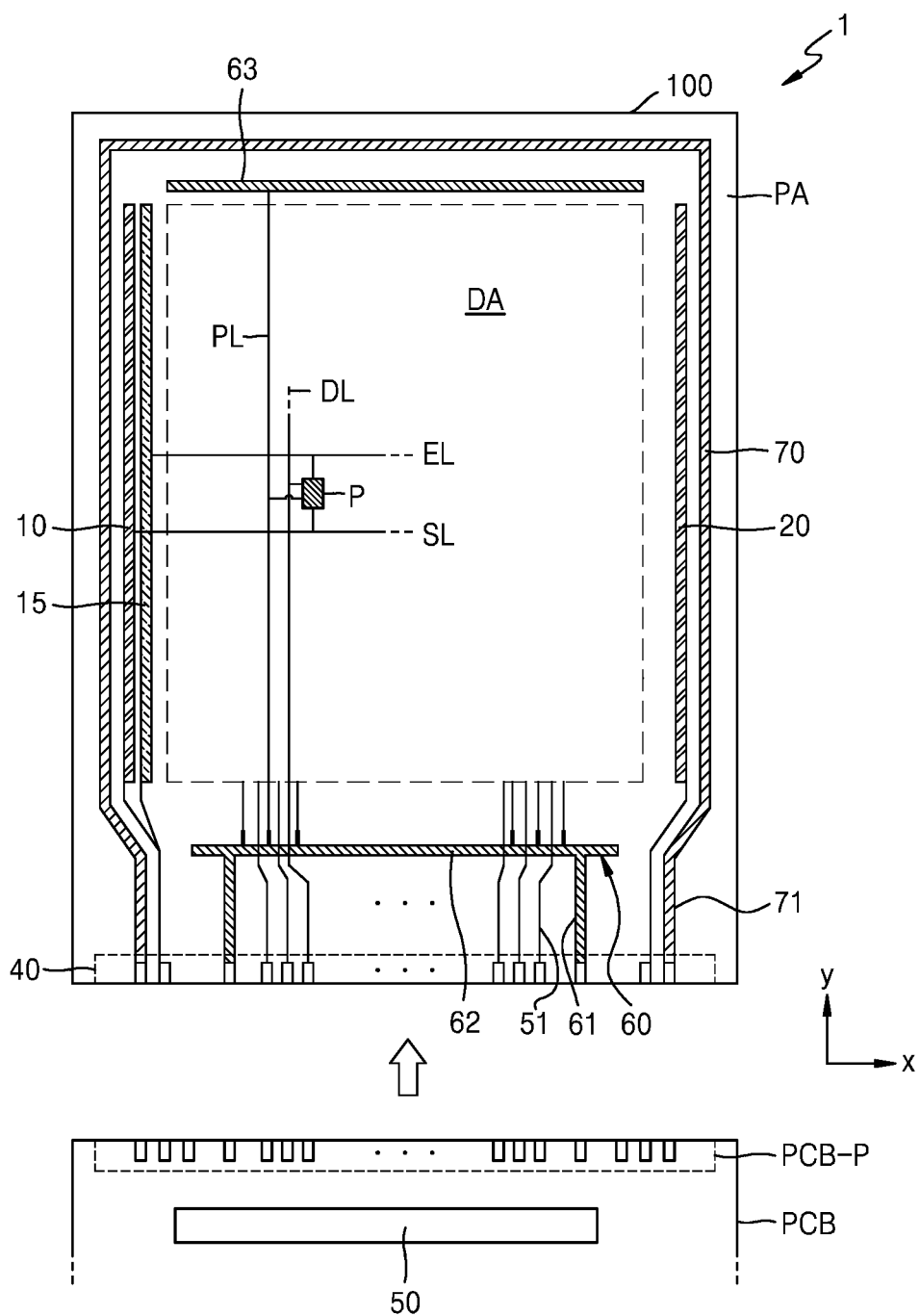
FIG. 2 is a plan view of the display device of FIG. 1.

FIG. 2 is a schematic plan view of a display device 1 according to an embodiment.

Referring to FIG. 2, the display device 1 may include pixels P arranged in a display area DA. Each of the pixels P may be electrically connected to outer circuits arranged in the peripheral area PA. A first scan driving circuit 10, a first emission driving circuit 15, a second scan driving circuit 20, a terminal 40, a data driving circuit 50, a first power supply line 60, and a second power supply line 70 may be arranged in the peripheral area PA.

The first scan driving circuit 10 may supply a scan signal to each pixel P through a scan line SL. The first emission driving circuit 15 may supply an emission control signal to each pixel P through an emission control line EL. The second scan driving circuit 20 may be arranged in parallel to the first scan driving circuit 10. For example, the display area DA may be between the first and second scan driving circuits 10 and 20. In an embodiment, some of the pixels P arranged in the display area DA may be electrically connected to the first scan driving circuit 10, and the others of the pixels P may be electrically connected to the second scan driving circuit 20. Alternatively, the second scan driving circuit 20 may be omitted.

The first emission driving circuit 15 may be spaced apart from the first scan driving circuit 10 in an x-axis direction and arranged in the peripheral area PA. Alternatively, the first emission driving circuit 15 and the first scan driving circuit 10 may be alternately arranged in a y-axis direction.

The terminal 40 may be arranged on one side of a substrate 100. The terminal 40 may not be covered by an insulating layer, and may be exposed. Thus, the terminal 40 may be electrically connected to a printed circuit board PCB. A terminal PCB-P of the printed circuit board PCB may be electrically connected to the terminal 40 of the display device 1. The printed circuit board PCB may be configured to supply signals or power of a controller to the display device 1. Control signals generated by the controller may be supplied to each of the first scan driving circuit 10, the first emission driving circuit 15, and the second scan driving circuit 20 through the printed circuit board PCB. The controller may supply a first power supply voltage ELVDD and a second power supply voltage ELVSS to the first power supply line 60 and the second power supply line 70 through a first connection line 61 and a second connection line 71, respectively. The first power supply voltage ELVDD may be supplied to each pixel P through a driving voltage line PL connected to the first power supply line 60, and the second power supply voltage ELVSS may be supplied to a second electrode of each pixel P connected to the second power supply line 70.

The data driving circuit 50 may be electrically connected to a data line DL. Data signals of the data driving circuit 50 may be supplied to each pixel P through a connection line 51 connected to the terminal 40 and the data line DL connected to the connection line 51.

FIG. 2 illustrates that the data driving circuit 50 is arranged on the printed circuit board PCB. However, in an embodiment, the data driving circuit 50 may be arranged on the substrate 100. For example, the data driving circuit 50 may be arranged between the terminal 40 and the first power supply line 60.

The first power supply line 60 may include a first sub-line 62 and a second sub-line 63, which extend in parallel to each other in the x-axis direction with the display area DA therebetween. The second power supply line 70 may have a shape of a loop having one open side and may partially surround the display area DA.

Figure 3:
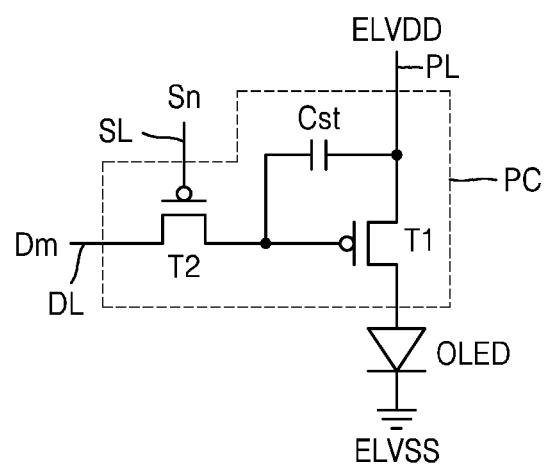
FIGS. 3 and 4 are equivalent circuit diagrams of embodiments of a pixel included in the display device of FIG. 1.
Figure 4:
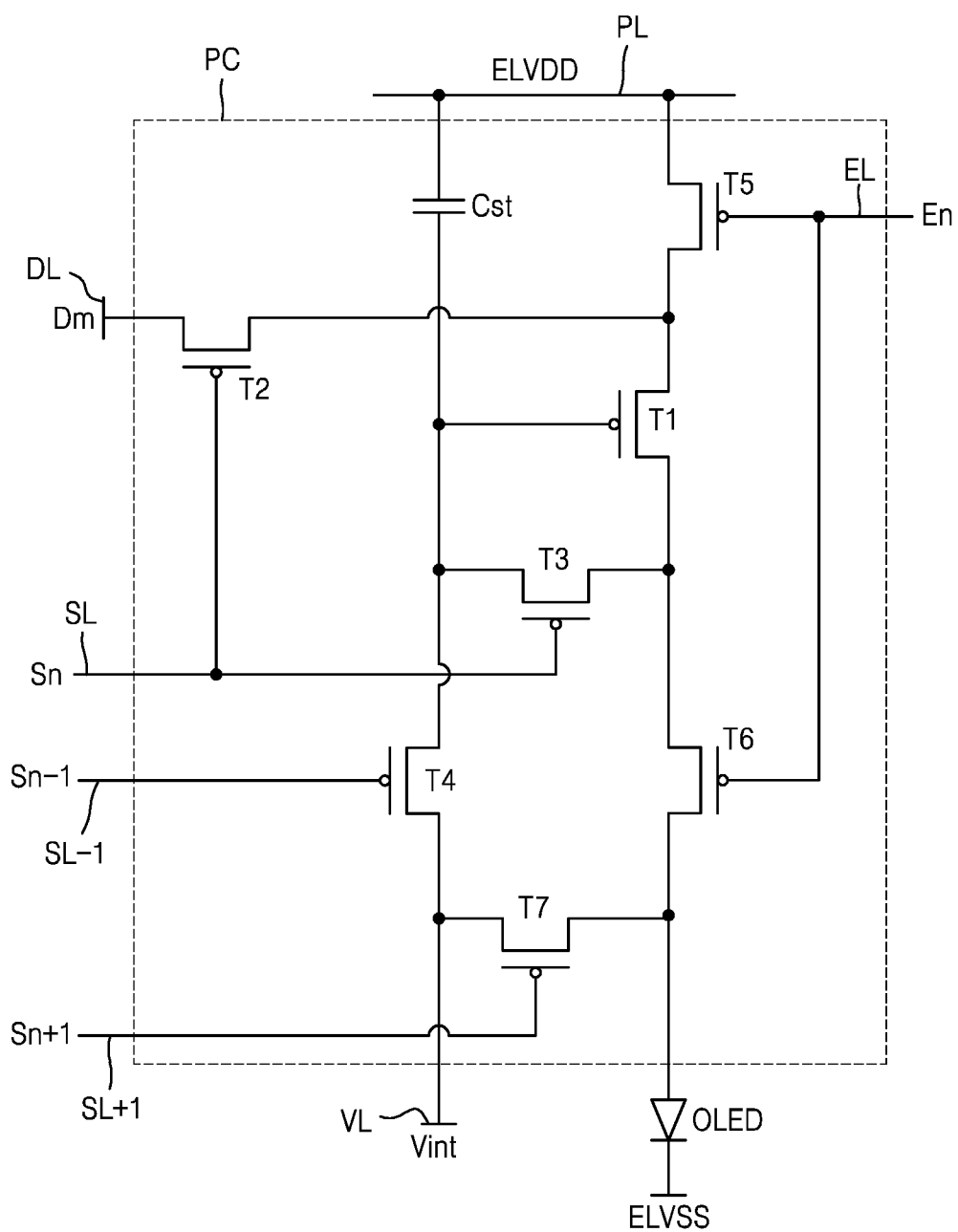

FIGS. 3 and 4 are equivalent circuit diagrams of a pixel included in a display device according to an embodiment. For example, the pixel may include a pixel circuit PC and an organic light-emitting diode OLED.

Referring to FIG. 3, the pixel circuit PC may be connected to an organic light-emitting diode OLED, and may control the organic light-emitting diode OLED to emit light from pixels. The pixel circuit PC may include a driving thin-film transistor T1, a switching thin-film transistor T2, and a storage capacitor Cst. The switching thin-film transistor T2 may be connected to a scan line SL and a data line DL. For example, the switching thin-film transistor T2 may transmit a data signal Dm supplied through the data line DL to the driving thin-film transistor T1 according to a scan signal Sn supplied through the scan line SL.

The storage capacitor Cst may be connected to the switching thin-film transistor T2 and a driving voltage line PL, and may store a voltage difference between a voltage received from the switching thin-film transistor T2 and a first power voltage ELVDD supplied to the driving voltage line PL.

The driving thin-film transistor T1 may be connected to the driving voltage line PL and the storage capacitor Cst, and may control a driving current flowing through the organic light-emitting diode OLED from the driving voltage line PL in response to the voltage difference stored in the storage capacitor Cst. The organic light-emitting diode OLED may emit light having a certain luminance according to a driving current.

FIG. 3 illustrates a case where the pixel circuit PC includes two thin-film transistors and one storage capacitor. However, embodiments are not limited thereto.

Referring to FIG. 4, a pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

Although FIG. 4 illustrates a case where signal lines SL, SL−1, SL+1, EL, and DL, an initialization voltage line VL, and a driving voltage line PL are supplied for each pixel circuit PC, embodiments are not limited thereto. For example, at least one of the signal lines SL, SL−1, SL+1, EL, and DL, and/or the initialization voltage line VL may be shared with neighboring pixel circuits.

The drain electrode of the driving thin-film transistor T1 may be electrically connected to an organic light-emitting diode OLED through the emission control thin-film transistor T6. The driving thin-film transistor T1 may receive a data signal Dm according to a switching operation of the switching thin-film transistor T2 and supply a driving current to the organic light-emitting diode OLED.

The gate electrode of the switching thin-film transistor T2 may be connected to a scan line SL, and the source electrode of the switching thin-film transistor T2 may be connected to a data line DL. The drain electrode of the switching thin-film transistor T2 may be connected to the source electrode of the driving thin-film transistor T1 and may be connected to the driving voltage line PL through the operation control thin-film transistor T5.

The switching thin-film transistor T2 may be turned on according to a scan signal Sn received through the scan line SL and perform a switching operation for transmitting the data signal Dm transmitted to the data line DL to the source electrode of the driving thin-film transistor T1.

The gate electrode of the compensation thin-film transistor T3 may be connected to the scan line SL. The source electrode of the compensation thin-film transistor T3 may be connected to the drain electrode of the driving thin-film transistor T1 and may be connected to a first electrode of the organic light-emitting diode OLED through the emission control thin-film transistor T6. The drain electrode of the compensation thin-film transistor T3 may be connected to one electrode of the storage capacitor Cst, the source electrode of the first initialization thin-film transistor T4, and the gate electrode of the driving thin-film transistor T1. The compensation thin-film transistor T3 may be turned on according to the scan signal Sn received through the scan line SL to connect the gate electrode and the drain electrode of the driving thin-film transistor T1 to each other. Thus, the driving thin-film transistor T1 may be diode-connected by the compensation thin-film transistor T3 being turned on.

The gate electrode of the first initialization thin-film transistor T4 may be connected to a previous scan line SL−1. The drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn-1 received through the previous scan line SL−1 and transmit an initialization voltage Vint to the gate electrode of the driving thin-film transistor T1 to perform an initialization operation for initializing a voltage of the gate electrode of the driving thin-film transistor T1.

The gate electrode of the operation control thin-film transistor T5 may be connected to an emission control line EL. The source electrode of the operation control thin-film transistor T5 may be connected to the driving voltage line PL. The drain electrode of the operation control thin-film transistor T5 may be connected to the source electrode of the driving thin-film transistor T1 and the drain electrode of the switching thin-film transistor T2.

The gate electrode of the emission control thin-film transistor T6 may be connected to the emission control line EL. The source electrode of the emission control thin-film transistor T6 may be connected to the drain electrode of the driving thin-film transistor T1 and the source electrode of the compensation thin-film transistor T3. The drain electrode of the emission control thin-film transistor T6 may be electrically connected to the first electrode of the organic light-emitting diode OLED. The operation control thin-film transistor T5 and the emission control thin-film transistor T6 may be simultaneously turned on according to an emission control signal En transmitted through the emission control line EL. Thus, a first power voltage ELVDD may be transmitted to the organic light-emitting diode OLED and a driving current may flow through the organic light-emitting diode OLED.

The gate electrode of the second initialization thin-film transistor T7 may be connected to a subsequent scan line SL+1. The source electrode of the second initialization thin-film transistor T7 may be connected to the first electrode of the organic light-emitting diode OLED. The drain electrode of the second initialization thin-film transistor T7 may be connected to the initialization voltage line VL. The second initialization thin-film transistor T7 may be turned on according to a subsequent scan signal Sn+1 received through the subsequent scan line SL+1 to initialize the first electrode of the organic light-emitting diode OLED.

In FIG. 4, the first initialization thin-film transistor T4 and the second initialization thin-film transistor T7 may be connected to the previous scan line SL−1 and the subsequent scan line SL+1, respectively. However, embodiments are not limited thereto. In an embodiment, both the first initialization thin-film transistor T4 and the second initialization thin-film transistor T7 may be connected to the previous scan line SL−1 and may be driven according to the previous scan signal Sn−1.

The other electrode of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

The second electrode (e.g., a cathode) of the organic light-emitting diode OLED may be supplied with a second power voltage ELVSS. The organic light-emitting diode OLED may emit light by receiving a driving current from the driving thin-film transistor T1.

The pixel circuit PC is not limited to a circuit design and the number of thin-film transistors and storage capacitors described with reference to FIG. 4, and the numbers of thin-film transistors and storage capacitors and the circuit design may vary.

Figure 5:
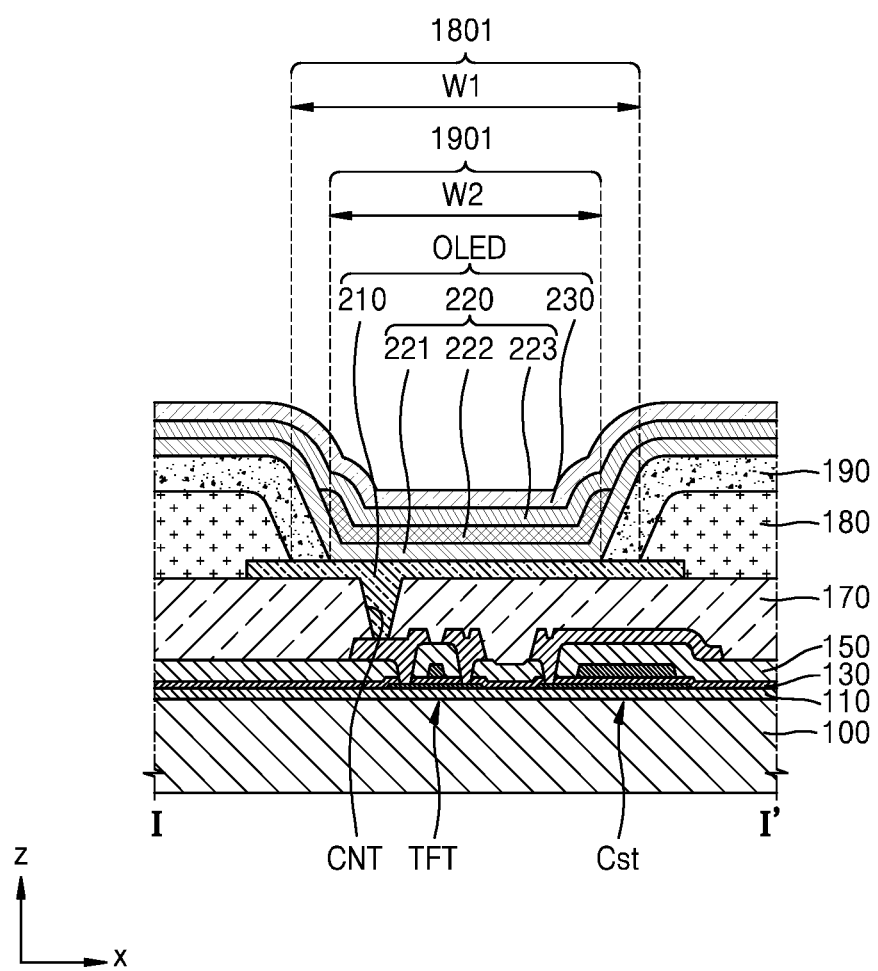
FIG. 5 is a cross-sectional view taken along lines I-I' of FIG. 1 illustrating an embodiment of the pixel of the display device of FIG. 1.

FIG. 5 is a schematic cross-sectional view taken along lines I-I' of FIG. 1 illustrating the pixel of the display device of FIG. 1.

Referring to FIG. 5, the pixel may include a thin-film transistor TFT, a storage capacitor Cst, a light-emitting element in the form of an organic light-emitting diode OLED, and a pixel-defining layer. The thin-film transistor TFT, the storage capacitor Cst, and the organic light-emitting diode OLED may be arranged on a substrate 100. For example, the pixel-defining layer may define the pixel by surrounding the organic light-emitting diode OLED of the pixel. For example, the pixel-defining layer may include a first pixel-defining layer 180 and a second pixel-defining layer 190.

The substrate 100 may include a glass material, a ceramic material, a metal material, or a flexible or bendable material. In an embodiment, the substrate 100 may include a polymer resin such as polyether sulfone, polyacrylate, polyether imide, polyethylene naphthalate, polyethylene terephthalate, polyphenylene sulfide, polyarylate, polycarbonate, or cellulose acetate propionate.

A buffer layer 110 may be formed to prevent impurities from penetrating into a semiconductor layer of the thin-film transistor TFT. A gate insulating layer 130 may insulate the semiconductor layer from the gate electrode of the thin-film transistor TFT. An interlayer insulating layer 150 may insulate the source electrode, the drain electrode, and the gate electrode of the thin-film transistor TFT. A planarization insulating layer 170 may cover the thin-film transistor TFT and have a substantially flat upper surface. For example, the buffer layer 110, the gate insulating layer 130, the interlayer insulating layer 150, and the planarization insulating layer 170 may be stacked on the substrate 100.

The organic light-emitting diode OLED may be arranged on the planarization insulating layer 170. For example, the organic light-emitting diode OLED may include a first electrode 210, an intermediate layer 220, and a second electrode 230. The first electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The first electrode 210 may further include a transparent conductive layer arranged above or/and below the reflective layer. The transparent conductive layer may include indium tin oxide (ITO), indium zinc oxide (IZO), zinc oxide (ZnO), indium oxide (In2O3), indium gallium oxide (IGO), aluminum zinc oxide (AZO), or the like. In an embodiment, the first electrode 210 may have a multilayer structure in which an ITO layer, an Ag layer, and an ITO layer are sequentially stacked. The first electrode 210 may be electrically connected to the thin-film transistor TFT through a contact hole CNT formed in the planarization insulating layer 170. For example, the first electrode 210 may be a pixel electrode layer, the intermediate layer 220 may be a light-emitting layer, and the second electrode 230 may be a common electrode layer.

A first pixel-defining layer 180 may be arranged on the first electrode 210. The first pixel-defining layer 180 may have a first opening 1801 exposing at least a portion of the first electrode 210. An edge portion of the first electrode 210 may be covered with the first pixel-defining layer 180. The edge portion of the first electrode 210 may directly contact the first pixel-defining layer 180 while overlapping the first pixel-defining layer 180. A central portion of the first electrode 210 may overlap the first opening 1801 of the first pixel-defining layer 180 and may be exposed through the first opening 1801. In an embodiment, the size (e.g., width) of the first opening 1801 may be less than the size (e.g., width) of the first electrode 210.

In an embodiment, the first pixel-defining layer 180 may include a colored material. The first pixel-defining layer 180 may include a colored pigment, for example, a pigment having a certain color such as white or black. In an embodiment, the first pixel-defining layer 180 may be black. In an embodiment, the first pixel-defining layer 180 may include a polyimide (PI)-based binder and a pigment in which red, green, and blue are mixed. Alternatively, the first pixel-defining layer 180 may include a cardo-based binder resin and a mixture of lactam black pigment and blue pigment. Alternatively, the first pixel-defining layer 180 may include carbon black. For example, the pigment may be insoluble in liquid.

In an embodiment, the first pixel-defining layer 180 may include a plurality of particles. The average size of the plurality of particles included in the first pixel-defining layer 180 may be about 200 nm or less. For example, the average size of the plurality of particles included in the first pixel-defining layer 180 may be about 10 nm to about 200 nm.

In an embodiment, the first pixel-defining layer 180 including a pigment may have an optical density of about 1 or more. As the first pixel-defining layer 180 including the pigment has an optical density of about 1 or more, the light transmittance of the first pixel-defining layer 180 may decrease, and at the same time, the contrast of the display device may be improved. Alternatively, in an embodiment, the first pixel-defining layer 180 may have an optical density of about 1.5 or more or may have an optical density of about 2 or more, and various modifications may be made.

Because the first pixel-defining layer 180 includes the pigment, reflection of external light may be prevented or reduced. For example, the first pixel-defining layer 180 including the pigment may prevent or reduce reflection of external light incident from the outside toward the display device, and may improve the contrast of the display device.

In an embodiment, a second pixel-defining layer 190 may be arranged on the first pixel-defining layer 180. The second pixel-defining layer 190 may have a second opening 1901 exposing at least a portion of the first electrode 210. The second opening 1901 formed in the second pixel-defining layer 190 may at least partially overlap the first opening 1801 formed in the first pixel-defining layer 180.

In an embodiment, the second pixel-defining layer 190 may include a dye. For example, the second pixel-defining layer 190 may include black dye dissolved in a solvent.

Because the second pixel-defining layer 190 includes the dye, reflection of external light may be prevented or reduced. For example, the second pixel-defining layer 190 including the dye may prevent or reduce reflection of external light incident from the outside toward the display device, and may improve the contrast of the display device. For example, the dye may be soluble in liquid.

In an embodiment, the optical density of the second pixel-defining layer 190 including the dye may be substantially equal to the optical density of the first pixel-defining layer 180 including the pigment. Alternatively, in an embodiment, the optical density of the second pixel-defining layer 190 including the dye may be substantially equal to or less than the optical density of the first pixel-defining layer 180 including the pigment. Accordingly, because the optical density of the second pixel-defining layer 190 including the dye is substantially equal to or less than the optical density of the first pixel-defining layer 180 including the pigment, the second pixel-defining layer 190 including the dye may have a light transmittance substantially equal to or higher than that of the first pixel-defining layer 180 including the pigment.

In an embodiment, the second pixel-defining layer 190 may cover the upper surface and the side surface of the first pixel-defining layer 180. Because the second pixel-defining layer 190 covers the upper surface and the side surface of the first pixel-defining layer 180, the second pixel-defining layer 190 may directly contact the first electrode 210. For example, at least a portion of the second pixel-defining layer 190 may not overlap the first pixel-defining layer 180. For example, the first pixel-defining layer 180 and the second pixel-defining layer 190 may have coplanar surfaces (e.g., bottom surfaces) on the first electrode 210. Accordingly, a width W1 of the first opening 1801 formed in the first pixel-defining layer 180 may be greater than a width W2 of the second opening 1901 formed in the second pixel-defining layer 190.

In an embodiment, the first pixel-defining layer 180 may include a pigment and a negative photosensitive material, and the second pixel-defining layer 190 may include a dye and a positive photosensitive material. In this case, as the first pixel-defining layer 180 includes a pigment and a negative photosensitive material, the first pixel-defining layer 180 may have a high optical density, and as the second pixel-defining layer 190 includes a dye and a positive photosensitive material, the occurrence of a residuum may be prevented or reduced.

In addition, in an embodiment, the first pixel-defining layer 180 including a pigment and the second pixel-defining layer 190 including a dye may overlap each other. Thus, the light transmittance of an area (e.g., a non-emission area) where the first pixel-defining layer 180 and the second pixel-defining layer 190 are arranged may be reduced. As a result, the contrast of the display device may be improved.

In a comparative example, although a portion of the first pixel-defining layer 180 located in a region corresponding to a central portion of the first electrode 210 is removed to form the first opening 1801 exposing at least a portion of the first electrode 210, the residue that has not been removed may remain on the first electrode 210, and the residue may cause dark spots. In particular, a short circuit may occur between the first electrode 210 and the second electrode 230 due to the residue remaining at an edge portion of the first opening 1801. Thus, dark spots may be caused due to the short circuit, and a residuum may be generated.

In addition, when a photosensitive polyimide (PSPI) is arranged on the first pixel-defining layer 180 in order to prevent the occurrence of the dark spots and the residuum, external light reflectance of the first electrode 210 may increase due to a decrease in the area of the first pixel-defining layer 180. Thus, the contrast of the display device may decrease. In addition, when the optical density of the first pixel-defining layer 180 is increased, dark spots may still occur at an edge portion of the first opening 1801.

In addition, when at least a portion of the first pixel-defining layer 180 is reflowed to cover the side surface of the first pixel-defining layer 180 in order to prevent the occurrence of the dark spots and the residuum, an area distribution of the first electrode 210 at least partially exposed by the first pixel-defining layer 180 may increase. Further, as the area distribution of the first electrode 210 increases, a lifespan distribution of the organic light-emitting diode OLED may increase.

In an embodiment, the second pixel-defining layer 190 including a dye may be arranged on the first pixel-defining layer 180 including a pigment, and the second pixel-defining layer 190 may cover the side of the first pixel-defining layer 180, and accordingly, the occurrence of dark spots may be prevented or reduced and external light reflectance of the first electrode 210 may be reduced, and thus, the contrast of the display device may be improved. For example, the second pixel-defining layer 190 may cover the residue remaining at an edge portion of the first opening 1801 to prevent or reduce the occurrence of a short circuit between the first electrode 210 and the second electrode 230, thereby preventing or reducing the occurrence of dark spots and preventing or reducing a residuum that is visually recognized at an edge portion of the organic light-emitting diode OLED.

In addition, as the second pixel-defining layer 190 covers the residue remaining at the edge portion of the first opening 1801, it is not necessary to perform a reflow process. Thus, the area distribution of the first electrode 210 may be reduced and the lifespan distribution of the organic light-emitting diode OLED may be reduced.

In an embodiment, the first pixel-defining layer 180 and the second pixel-defining layer 190 may each include a negative photosensitive material. For example, the first pixel-defining layer 180 may include a pigment and a negative photosensitive material, and the second pixel-defining layer 190 may include a dye and a negative photosensitive material.

In an embodiment, the first pixel-defining layer 180 and the second pixel-defining layer 190 may each include a positive photosensitive material. For example, the first pixel-defining layer 180 may include a pigment and a positive photosensitive material, and the second pixel-defining layer 190 may include a dye and a positive photosensitive material.

In an embodiment, the first pixel-defining layer 180 may include a positive photosensitive material, and the second pixel-defining layer 190 may include a negative photosensitive material. For example, the first pixel-defining layer 180 may include a pigment and a positive photosensitive material, and the second pixel-defining layer 190 may include a dye and a negative photosensitive material.

In an embodiment, the intermediate layer 220 may be arranged on the first electrode 210. The intermediate layer 220 may include a first functional layer 221, an emission layer 222, and a second functional layer 223. In an embodiment, the emission layer 222 may be arranged in the second opening 1901 formed in the second pixel-defining layer 190. For example, the emission layer 222 may fill the second opening 1901 formed in the second pixel-defining layer 190, the first functional layer 221 may be arranged under the emission layer 222, and the second functional layer 223 may be arranged on the emission layer 222.

The emission layer 222 may include an organic material. The emission layer 222 may include a polymer organic material or a low molecular weight organic material, which emits light of a certain color. The emission layer 222 may be formed by a deposition process using a mask.

The first functional layer 221 may include a single layer or multiple layers. For example, when the first functional layer 221 is formed of a polymer material, the first functional layer 221 may be a hole transport layer (HTL) having a single-layer structure and may be formed of poly-(3,4)-ethylene-dihydroxythiophene (PEDOT) or polyaniline (PANT). When the first functional layer 221 is formed of a low molecular weight organic material, the first functional layer 221 may include a hole injection layer (HIL) and a hole transport layer (HTL). The first functional layer 221 may be formed by, for example, a thermal evaporation method.

The second functional layer 223 may be optional. For example, the second functional layer 223 may be omitted. For example, when the first functional layer 221 and the emission layer 222 are formed of a polymer material, it may be desirable to form the second functional layer 223. The second functional layer 223 may include a single layer or multiple layers. The second functional layer 223 may include an electron transport layer (ETL) and/or an electron injection layer (EIL). The second functional layer 223 may be formed by, for example, a thermal evaporation method.

The second electrode 230 may be arranged on the intermediate layer 220. The second electrode 230 may be formed of a conductive material having a relatively low work function. For example, the second electrode 230 may include a transparent layer (or a semi-transparent layer) including silver (Ag), magnesium (Mg), aluminum (Al), nickel (Ni), chromium (Cr), lithium (Li), calcium (Ca), or an alloy thereof. Alternatively, the second electrode 230 may further include a layer including ITO, IZO, ZnO, or $In_2O_3$ on the transparent layer (or the semi-transparent layer) including the above-described material. In an embodiment, the second electrode 230 may include Ag and Mg.

A stacked structure, in which the first electrode 210, the intermediate layer 220, and the second electrode 230 are sequentially stacked, may form a light-emitting diode, such as an organic light-emitting diode OLED.

Figure 6:
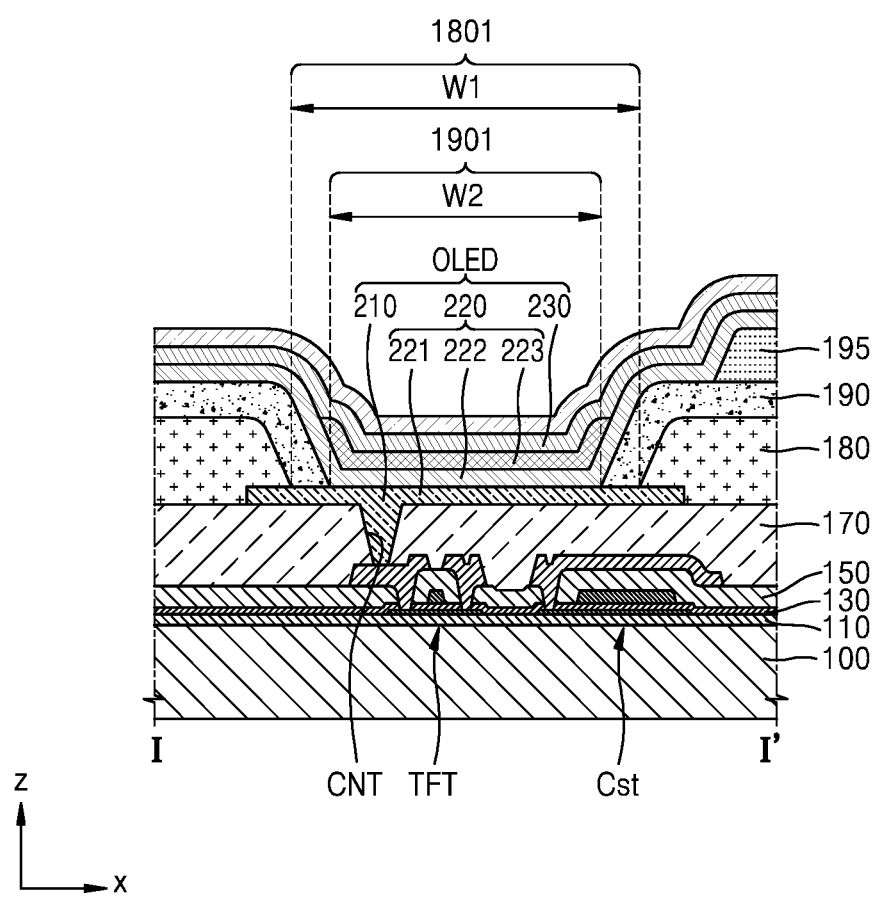
FIG. 6 is a schematic cross-sectional view taken along lines I-I' of FIG. 1 illustrating another embodiment of the pixel of the display device of FIG. 1.

FIG. 6 is a schematic cross-sectional view of a display device according to an embodiment. The embodiment of FIG. 6 is different from the embodiment of FIG. 5 in that a spacer 195 is further arranged on a second pixel-defining layer 190. In FIG. 6, the same reference numerals as those in FIG. 5 denote the same members, and repeated descriptions thereof will be omitted for descriptive convenience.

Referring to FIG. 6, the spacer 195 may be further arranged on a second pixel-defining layer 190. The spacer 195 may be arranged not to overlap a first opening 1801 formed in a first pixel-defining layer 180 and/or a second opening 1901 formed in the second pixel-defining layer 190.

For example, the spacer 195 may at least partially overlap the first pixel-defining layer 180 and/or the second pixel-defining layer 190.

In an embodiment, the spacer 195 may be formed by the same process by which the second pixel-defining layer 190 is formed. For example, the second pixel-defining layer 190 and the spacer 195 may be simultaneously formed by a process using a halftone mask. Accordingly, the spacer 195 may include the same material as the second pixel-defining layer 190. For example, the spacer 195 may include a dye and may include a negative photosensitive material.

As the spacer 195 is arranged on the first pixel-defining layer 180 and/or the second pixel-defining layer 190, the damage of the organic light-emitting diode OLED due to a mask imprint may be prevented or reduced.

Figure 7:
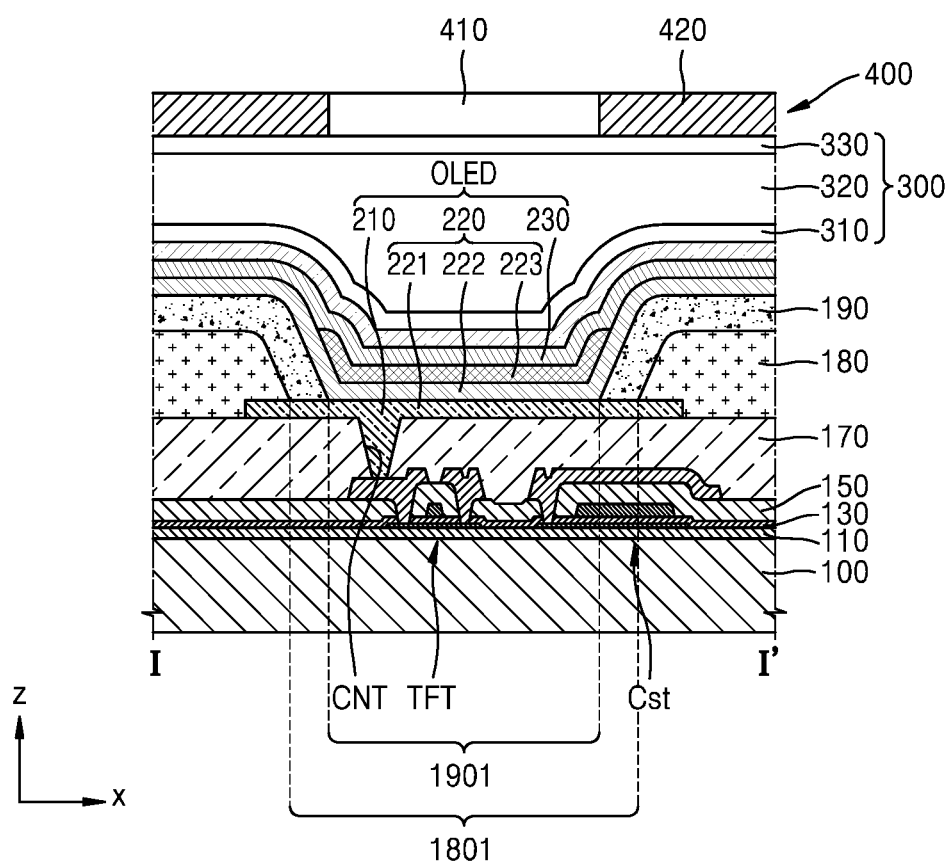
FIGS. 7 and 8 are schematic cross-sectional views taken along lines I-I' of FIG. 1 illustrating other embodiments of the pixel of the display device of FIG. 1.
Figure 8:
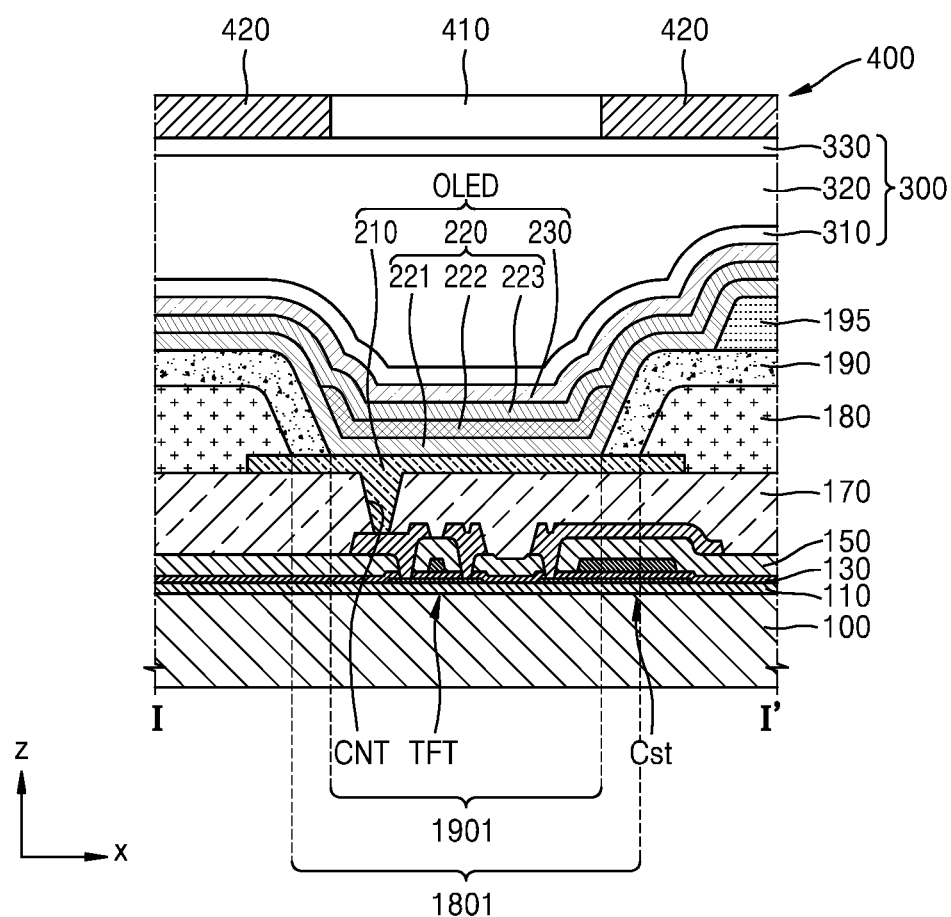

FIGS. 7 and 8 are schematic cross-sectional views of a display device according to an embodiment. The embodiments of FIGS. 7 and 8 are different from the embodiments of FIGS. 5 and 6 in that a thin-film encapsulation layer 300 and an optical functional layer 400 are further arranged on an organic light-emitting diode OLED. In FIGS. 7, and 8, the same reference numerals as those in FIGS. 5 and 6 denote the same members, and repeated descriptions thereof will be omitted for descriptive convenience.

Referring to FIGS. 7 and 8, the thin-film encapsulation layer 300 may be arranged on the organic light-emitting diode OLED. The thin-film encapsulation layer 300 may include at least one inorganic layer and at least one organic layer. In an embodiment, the thin-film encapsulation layer 300 may include a first inorganic layer 310, an organic layer 320, and a second inorganic layer 330 that are sequentially stacked.

Each of the first inorganic layer 310 and the second inorganic layer 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first inorganic layer 310 and the second inorganic layer 330 may be formed by a chemical vapor deposition method.

The organic layer 320 may include a polymer-based material. Examples of polymer-based materials may include acrylic resins, epoxy resins, polyimide, and polyethylene. For example, the organic layer 320 may include an acrylic resin, such as polymethyl methacrylate, polyacrylic acid, or the like. The organic layer 320 may be formed by curing a monomer or by applying a polymer.

The optical functional layer 400 may be arranged on the thin-film encapsulation layer 300. The optical functional layer 400 may include a color filter 410 and a black matrix 420 as components for preventing reflection of external light. A display device including the optical functional layer 400 including the color filter 410 and the black matrix 420 may have a significantly reduced thickness compared to a display device including a polarizing plate.

In an embodiment, the color filter 410 may be arranged to overlap a first opening 1801 formed in a first pixel-defining layer 180 and/or a second opening 1901 formed in a second pixel-defining layer 190. For example, the light emitted from the organic light-emitting diode OLED may pass through the thin-film encapsulation layer 300 and the color filter 410. In an embodiment, the color filter 410 may include an organic material pattern including a dye or a pigment.

In an embodiment, the black matrix 420 may be arranged to at least partially overlap the first pixel-defining layer 180 and/or the second pixel-defining layer 190. In an embodiment, the black matrix 420 may include chromium (Cr), chromium oxide ($CrO_X$), an organic material mixed with a black pigment, or the like. When the black matrix 420 is formed of Cr or $CrO_X$, the black matrix 420 may be a single layer or multiple layers including Cr or $CrO_X$. In an embodiment, the black matrix 420 may include the same material as the first pixel-defining layer 180 or the second pixel-defining layer 190.

FIGS. 9, 10, 11, 12, 13, 14, and 15 are cross-sectional views illustrating processes according to a method of manufacturing a display device according to an embodiment.

Figure 9:
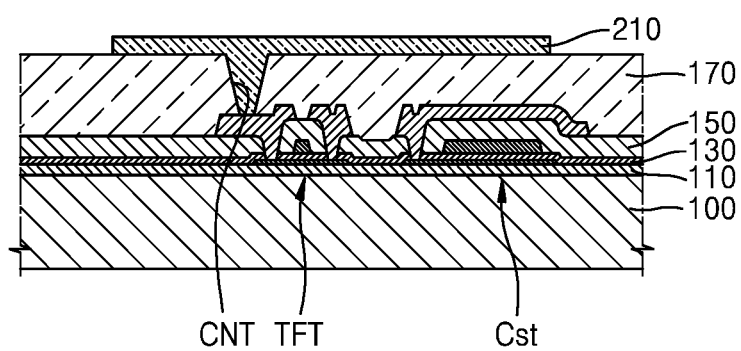
FIGS. 9, 10, 11, 12, 13, 14, and 15 are cross-sectional views for illustrating processes according to a method of manufacturing the display device of FIG. 1.

Referring to FIG. 9, a first electrode 210 may be formed on a substrate 100. In an embodiment, FIG. 9 illustrates that the first electrode 210 is formed on a planarization insulating layer 170. Before the first electrode 210 is formed, a thin-film transistor TFT and a storage capacitor Cst may be formed on the substrate 100.

The substrate 100 may be formed of a variety of materials, such as a glass material, a metal material, or a plastic material such as polyethylene terephthalate (PET), polyethylene naphthalate (PEN), or polyimide. A buffer layer 110 may be formed to prevent impurities from penetrating into a semiconductor layer of the thin-film transistor TFT. A gate insulating layer 130 may insulate the semiconductor layer from the gate electrode of the thin-film transistor TFT. An interlayer insulating layer 150 may insulate the source electrode, the drain electrode, and the gate electrode of the thin-film transistor TFT. A planarization insulating layer 170 may cover the thin-film transistor TFT and have a substantially flat upper surface. For example, the buffer layer 110, the gate insulating layer 130, the interlayer insulating layer 150, and the planarization insulating layer 170 may be formed on the substrate 100.

The first electrode 210 may include a reflective layer including Ag, Mg, Al, Pt, Pd, Au, Ni, Nd, Ir, Cr, or a compound thereof. The first electrode 210 may include a reflective layer including the above-described material, and a transparent conductive layer arranged above or/and below the reflective layer. The transparent conductive layer may include indium tin oxide (ITO), indium zinc oxide (IZO), zinc oxide (ZnO), indium oxide ($In_2O_3$), indium gallium oxide (IGO), aluminum zinc oxide (AZO), or the like. In an embodiment, the first electrode 210 may have a multilayer structure in which an ITO layer, an Ag layer, and an ITO layer are sequentially stacked.

Figure 10:
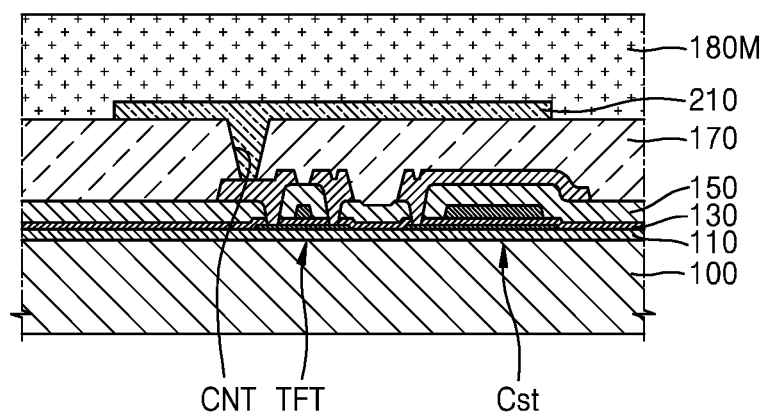

Thereafter, as shown in FIG. 10, a first colored material layer 180M may be formed on the first electrode 210. The first colored material layer 180M may be entirely coated on the substrate 100. In an embodiment, the first colored material layer 180M may include a pigment. In an embodiment, the first colored material layer 180M may include a negative photosensitive material. Alternatively, in an embodiment, the first colored material layer 180M may include a positive photosensitive material.

Figure 11:
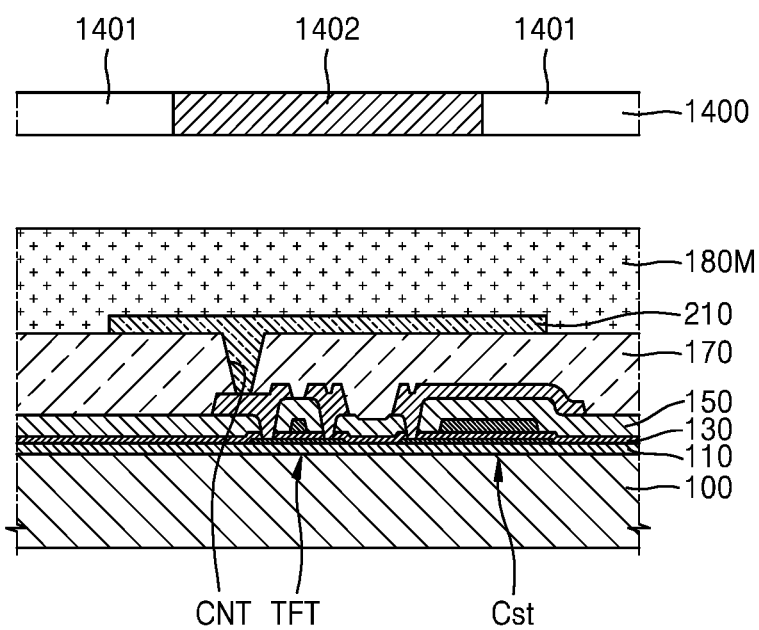

Thereafter, as shown in FIG. 11, the first colored material layer 180M may be patterned (or exposed to light) using a mask 1400. The mask 1400 may include a light-transmitting portion 1401 and a light-blocking portion 1402.

In an embodiment, when the first colored material layer 180M includes a negative photosensitive material, the light-transmitting portion 1401 of the mask 1400 may not overlap the first electrode 210 or may overlap an edge portion of the first electrode 210, and the light-blocking portion 1402 of the mask 1400 may overlap a central portion of the first electrode 210. Accordingly, a portion of the first colored material layer 180M, which overlaps the central portion of the first electrode 210, may not be exposed to light, and the remaining portion of the first colored material layer 180M may be exposed to light.

In an embodiment, when the first colored material layer 180M includes a positive photosensitive material, the light-transmitting portion 1401 of the mask 1400 may overlap the central portion of the first electrode 210, and the light-blocking portion 1402 of the mask 1400 may not overlap the first electrode 210 or may overlap an edge portion of the first electrode 210. In this case, a portion of the first colored material layer 180M, which overlaps the central portion of the first electrode 210, may be exposed to light, and the remaining portion of the first colored material layer 180M may not be exposed to light.

Figure 12:
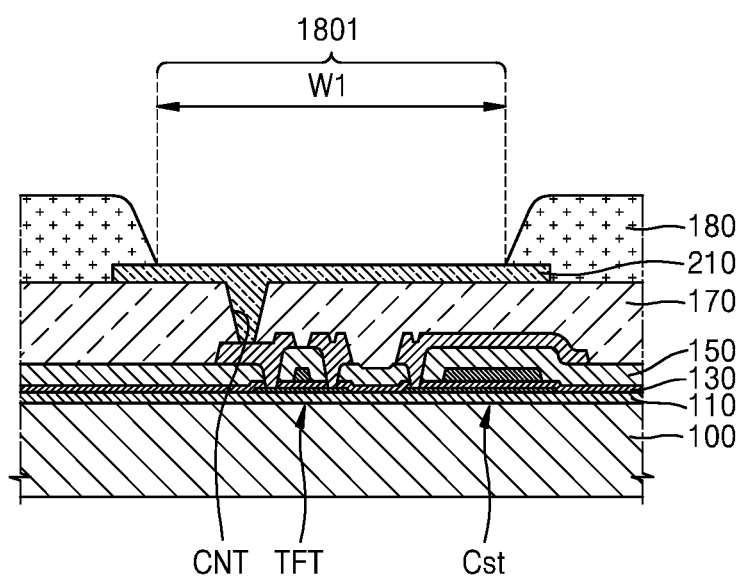

Thereafter, the first colored material layer 180M having the exposed portion may be developed. Through the development, as shown in FIG. 12, a first pixel-defining layer 180 including a first opening 1801 may be formed on the substrate 100. In an embodiment, the first opening 1801 formed in the first pixel-defining layer 180 may have a first width W1.

In an embodiment, the first pixel-defining layer 180 may include a colored material. The first pixel-defining layer 180 may include a colored pigment, for example, a pigment having a certain color such as white or black. In an embodiment, the first pixel-defining layer 180 may be black. In an embodiment, the first pixel-defining layer 180 may include a polyimide (PI)-based binder and a pigment in which red, green, and blue are mixed. Alternatively, the first pixel-defining layer 180 may include a cardo-based binder resin and a mixture of lactam black pigment and blue pigment. Alternatively, the first pixel-defining layer 180 may include carbon black.

Because the first pixel-defining layer 180 is formed from the first colored material layer 180M, the first pixel-defining layer 180 may include a negative photosensitive material or a positive photosensitive material, and because the first pixel-defining layer 180 includes a pigment, the first pixel-defining layer 180 may prevent reflection of external light. The first pixel-defining layer 180 including the pigment may prevent reflection of external light incident from the outside toward the display device, and may improve the contrast of the display device.

Figure 13:
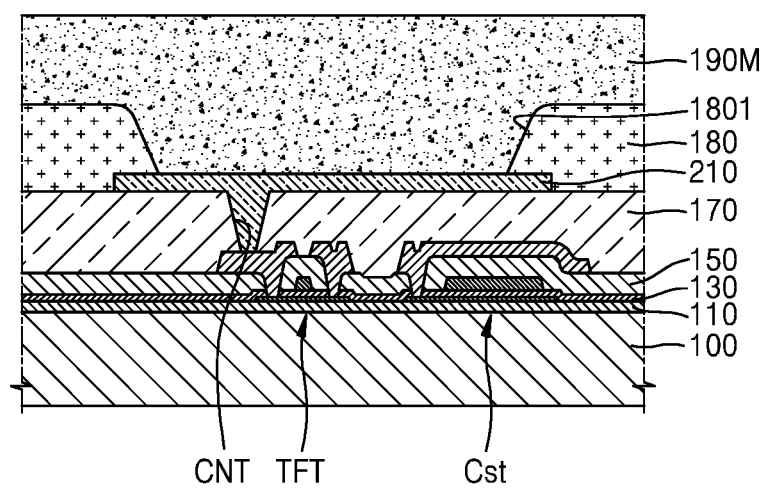

Thereafter, as shown in FIG. 13, a second colored material layer 190M may be formed on the first electrode 210 and the first pixel-defining layer 180. The second colored material layer 190M may be entirely coated on the substrate 100 to cover the first electrode 210 and the first pixel-defining layer 180. In an embodiment, the second colored material layer 190M may include a dye. For example, the second colored material layer 190M may include black dye dissolved in a solvent. In an embodiment, the second colored material layer 190M may include a positive photosensitive material. Alternatively, in an embodiment, the second colored material layer 190M may include a negative photosensitive material.

Figure 14:
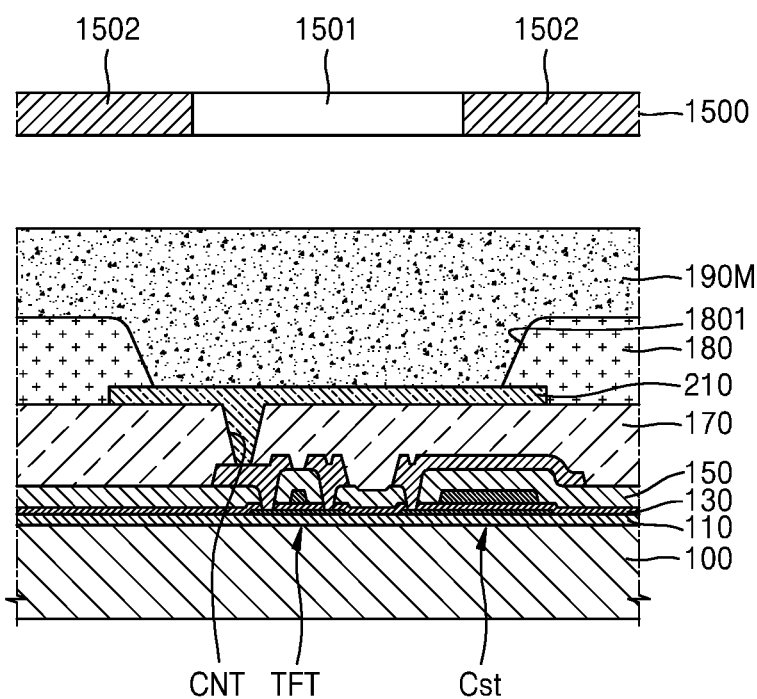

Thereafter, as shown in FIG. 14, the second colored material layer 190M may be patterned (or exposed to light) using a mask 1500. The mask 1500 may include a light-transmitting portion 1501 and a light-blocking portion 1502.

In an embodiment, when the second colored material layer 190M includes a positive photosensitive material, the light-transmitting portion 1501 of the mask 1500 may overlap a central portion of the first electrode 210 and/or the first opening 1801 formed in the first pixel-defining layer 180, and the light-blocking portion 1502 of the mask 1500 may at least partially overlap an edge portion of the first electrode 210 and/or the first pixel-defining layer 180. Accordingly, a portion of the second colored material layer 190M, which overlaps a central portion of the first electrode 210 and/or the first opening 1801 formed in the first pixel-defining layer 180, may be exposed to light, and the remaining portion of the second colored material layer 190M may not be exposed to light.

In an embodiment, when the second colored material layer 190M includes a negative photosensitive material, the light-transmitting portion 1501 of the mask 1500 may at least partially overlap an edge portion of the first electrode 210 and/or the first pixel-defining layer 180, and the light-blocking portion 1502 of the mask 1500 may overlap a central portion of the first electrode 210 and/or the first opening 1801 formed in the first pixel-defining layer 180. In this case, a portion of the second colored material layer 190M, which at least partially overlaps the edge portion of the first electrode 210 and/or the first pixel-defining layer 180, may be exposed to light, and the remaining portion of the second colored material layer 190M may not be exposed to light.

Figure 15:
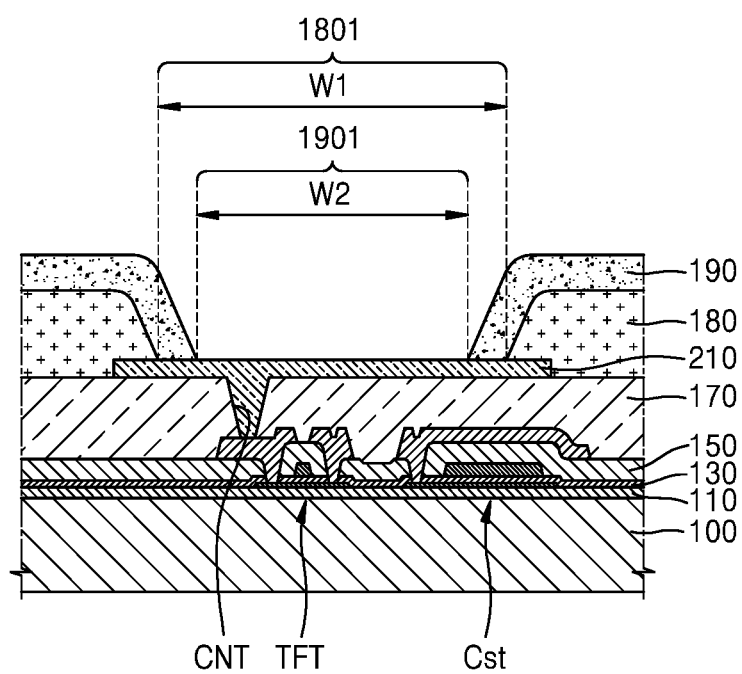

Thereafter, the second colored material layer 190M having the exposed portion may be developed. Through development, as shown in FIG. 15, a second pixel-defining layer 190 including a second opening 1901 may be formed on the substrate 100. In an embodiment, the first opening 1801 formed in the first pixel-defining layer 180 and the second opening 1901 formed in the second pixel-defining layer 190 may at least partially overlap each other.

In an embodiment, the first opening 1801 formed in the first pixel-defining layer 180 may have a first width W1, and the second opening 1901 formed in the second pixel-defining layer 190 may have a second width W2 that is less than the first width W1. In an embodiment, the second pixel-defining layer 190 may cover the upper surface and the side surface of the first pixel-defining layer 180. Accordingly, at least a portion of the second pixel-defining layer 190 may directly contact the first electrode 210. For example, at least a portion of the second pixel-defining layer 190 may not overlap the first pixel-defining layer 180. For example, the first pixel-defining layer 180 and the second pixel-defining layer 190 may have coplanar surfaces (e.g., bottom surfaces) on the first electrode 210.

In an embodiment, the second pixel-defining layer 190 may include a colored material. For example, the second pixel-defining layer 190 may include a colored dye. In an embodiment, the second pixel-defining layer 190 may be black.

Because the second pixel-defining layer 190 is formed from the second colored material layer 190M, the second pixel-defining layer 190 may include a positive photosensitive material or a negative photosensitive material, and because the second pixel-defining layer 190 includes a dye, the second pixel-defining layer 190 may prevent reflection of external light. The second pixel-defining layer 190 including the dye may prevent reflection of external light incident from the outside toward the display device, and may improve the contrast of the display device.

In an embodiment, the second pixel-defining layer 190 including the dye may have an optical density substantially equal to or less than that of the first pixel-defining layer 180 including the pigment. Because the second pixel-defining layer 190 including the dye has an optical density substantially equal to or less than that of the first pixel-defining layer 180 including the pigment, the second pixel-defining layer 190 including the dye may have a higher light transmittance than the first pixel-defining layer 180.

Figure 16:
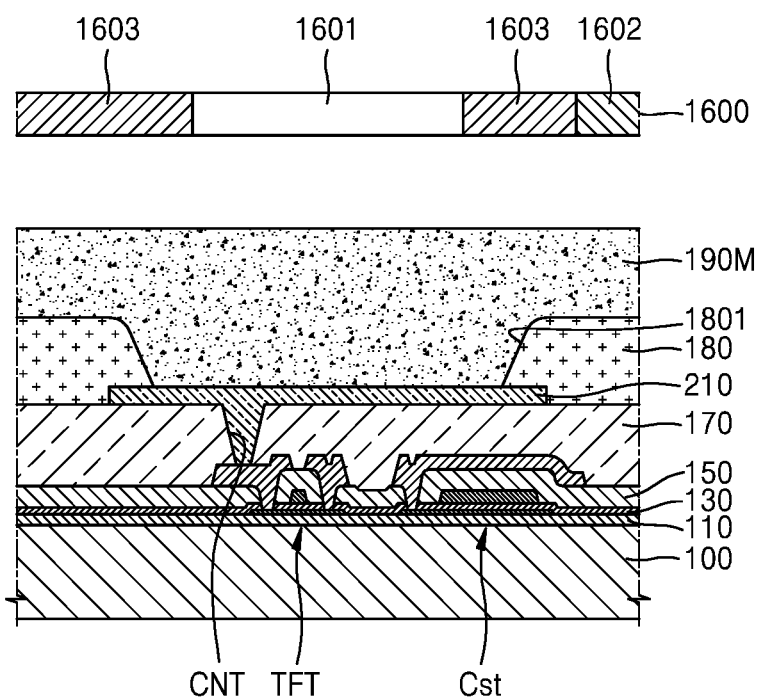
FIGS. 16 and 17 are cross-sectional views for illustrating other processes according to a method of manufacturing a display device according to an embodiment.
Figure 17:
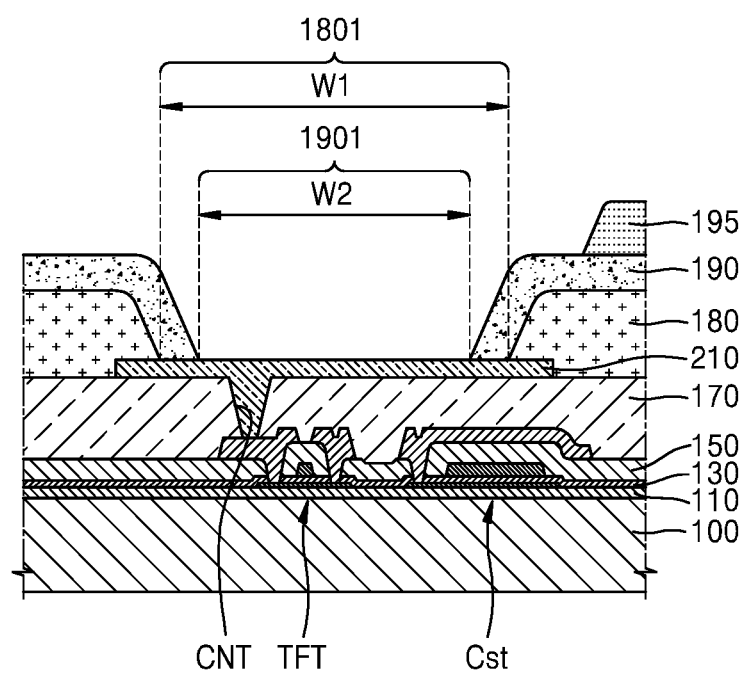

FIGS. 16 and 17 are cross-sectional views illustrating processes according to a method of manufacturing a display device according to an embodiment. The embodiments of FIGS. 16 and 17 are different from the embodiment of FIGS. 14 and 15 in that a spacer 195 is formed on a second pixel-defining layer 190. In FIGS. 16 and 17, the same reference numerals as those in FIGS. 14 and 15 denote the same members, and repeated descriptions thereof will be omitted for descriptive convenience.

Referring to FIG. 16, after a second colored material layer 190M is formed on a first electrode 210 and a first pixel-defining layer 180, the second colored material layer 190M may be patterned (or exposed to light) using a mask 1600. The mask 1600 may include a light-transmitting portion 1601, a light-blocking portion 1602, and a semi-light-transmitting portion 1603. For example, the mask 1600 may be a halftone mask.

In an embodiment, when the second colored material layer 190M includes a positive photosensitive material, the light-transmitting portion 1601 of the mask 1600 may overlap a central portion of the first electrode 210 and/or a first opening 1801 formed in the first pixel-defining layer 180, the light-blocking portion 1602 of the mask 1600 may at least partially overlap the first pixel-defining layer 180, and the semi-light-transmitting portion 1603 of the mask 1600 may at least partially overlap an edge portion of the first electrode 210 and/or the first pixel-defining layer 180. Accordingly, a portion of the second colored material layer 190M, which overlaps the central portion of the first electrode 210 and/or the first opening 1801 formed in the first pixel-defining layer 180, may be exposed to light, a portion of the second colored material layer 190M, which overlaps at least a portion of the first pixel-defining layer 180, may not be exposed to light, and the remaining portion of the second colored material layer 190M may be exposed to light by about half of the thickness of the second colored material layer 190M.

For example, a portion of the second colored material layer 190M, which overlaps the light-transmitting portion 1601 of the mask 1600, may be exposed to light, a second portion of the second colored material layer 190M, which overlaps the light-blocking portion 1602 of the mask 1600, may not be exposed to light, and a portion of the second colored material layer 190M, which overlaps the semi-light-transmitting portion 1603 of the mask 1600, may be exposed to light by about half of the thickness of the portion of the second colored material layer 190M, which overlaps the light-blocking portion 1602 of the mask 1600 and thus is not exposed to light. In other words, a portion of the second colored material layer 190M, which overlaps the semi-light-transmitting portion 1603 of the mask 1600, may be exposed to light by about half of the thickness of the portion of the second colored material layer 190M.

In an embodiment, when the second colored material layer 190M includes a negative photosensitive material, the light-blocking portion 1602 of the mask 1600 may overlap a central portion of the first electrode 210 and/or a first opening 1801 formed in the first pixel-defining layer 180, the light-transmitting portion 1601 of the mask 1600 may at least partially overlap the first pixel-defining layer 180, and the semi-light-transmitting portion 1603 of the mask 1600 may at least partially overlap an edge portion of the first electrode 210 and/or the first pixel-defining layer 180. Accordingly, a portion of the second colored material layer 190M, which overlaps the central portion of the first electrode 210 and/or the first opening 1801 formed in the first pixel-defining layer 180, may not be exposed to light, a portion of the second colored material layer 190M, which overlaps at least a portion of the first pixel-defining layer 180, may be exposed to light, and the remaining portion of the second colored material layer 190M may be exposed to light by about half of the thickness of the remaining portion of the second colored material layer 190M.

For example, a portion of the second colored material layer 190M, which overlaps the light-transmitting portion 1601 of the mask 1600, may be exposed to light, a portion of the second colored material layer 190M, which overlaps the light-blocking portion 1602 of the mask 1600, may not be exposed to light, and a portion of the second colored material layer 190M, which overlaps the semi-light-transmitting portion 1603 of the mask 1600, may be exposed to light by about half of the thickness of the portion of the second colored material layer 190M, which overlaps the light-blocking portion 1602 of the mask 1600 and thus is not exposed to light. In other words, a portion of the second colored material layer 190M, which overlaps the semi-light-transmitting portion 1603 of the mask 1600, may be exposed to light by about half of the thickness of the portion of the second colored material layer 190M.

Thereafter, the second colored material layer 190M having the exposed portion may be developed. Through development, as shown in FIG. 17, a second pixel-defining layer 190 including a second opening 1901, and a spacer 195 on the second pixel-defining layer 190 may be formed on the substrate 100. For example, an area overlapping the light-transmitting portion 1601 of the mask 1600 may correspond to the second opening 1901, an area overlapping the light-blocking portion 1602 of the mask 1600 may correspond to the spacer 195, and an area overlapping the semi-light-transmitting portion 1603 of the mask 1600 may correspond to the second pixel-defining layer 190.

In an embodiment, as the second pixel-defining layer 190 and the spacer 195 are formed by the same process, the second pixel-defining layer 190 and the spacer 195 may be integrally provided. Also, the second pixel-defining layer 190 and the spacer 195 may include the same material.

After the process of FIG. 15 and/or the process of FIG. 17, for example, an intermediate layer 220 (see FIG. 5) and a second electrode 230 (see FIG. 5) may be formed on the first electrode 210 at least partially exposed through the second opening 1901 formed in the second pixel-defining layer 190.

In an embodiment, the intermediate layer 220 may include an emission layer 222 arranged in the second opening 1901, and may further include a first functional layer 221 formed under the emission layer 222 and a second functional layer 223 formed on the emission layer 222.

The first electrode 210, the intermediate layer 220, and the second electrode 230, which are sequentially stacked, may form an organic light-emitting diode OLED.

Thereafter, for example, a thin-film encapsulation layer 300 (see FIG. 7) including at least one inorganic layer and at least one organic layer may be formed on the organic light-emitting diode OLED, and an optical functional layer 400 (see FIG. 7) may be formed on the thin-film encapsulation layer 300.

The optical functional layer 400 may include a color filter 410 (see FIG. 7) and a black matrix 420 (see FIG. 7).

According to one or more embodiments made as described above, a display device in which the occurrence of dark spots is prevented and contrast deterioration is prevented may be provided. Obviously, the scope of the disclosure is not limited by these effects.

Although certain exemplary embodiments and implementations have been described herein, other embodiments and modifications will be apparent from his description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a first electrode disposed on the substrate;
a first pixel-defining layer disposed on the first electrode, the first pixel-defining layer having a first opening exposing at least a portion of the first electrode and comprising a negative photosensitive material and a black pigment; and
a second pixel-defining layer disposed on the first pixel-defining layer and comprising a positive photosensitive material and a black dye, wherein the first pixel-defining layer has an optical density of 1 or more, and an optical density of the second pixel-defining layer is less than an optical density of the first pixel-defining layer.

2. The display device of claim 1, wherein:
the first pixel-defining layer comprises a plurality of particles, and
an average size of the plurality of particles is about 200 nm or less.

3. The display device of claim 1, wherein the second pixel-defining layer has a second opening exposing at least a portion of the first electrode.

4. The display device of claim 3, wherein a width of the first opening is greater than a width of the second opening.

5. The display device of claim 4, wherein the second pixel-defining layer covers an upper surface and a side surface of the first pixel-defining layer.

6. The display device of claim 4, wherein the second pixel-defining layer is in direct contact with the first electrode.

7. The display device of claim 1, further comprising a spacer disposed on the second pixel-defining layer,
wherein the spacer comprises a same material as the second pixel-defining layer.

8. The display device of claim 7, wherein the first pixel-defining layer and the spacer are formed of different materials from each other.

9. The display device of claim 3, further comprising:
an intermediate layer comprising an emission layer filling the second opening; and
a second electrode disposed on the intermediate layer.

10. The display device of claim 9, further comprising a thin-film encapsulation layer disposed on the second electrode, the thin-film encapsulation layer comprising at least one inorganic layer and at least one organic layer.

11. The display device of claim 10, further comprising an optical functional layer disposed on the thin-film encapsulation layer, the optical functional layer comprising a color filter at least partially overlapping the first opening and a black matrix surrounding the color filter.

12. The display device of claim 11, wherein the black matrix at least partially overlaps the first pixel-defining layer.

13. The display device of claim 11, wherein the black matrix at least partially overlaps the second pixel-defining layer.

14. A display device comprising:
a plurality of pixels, each pixel comprising a pixel electrode; and
a pixel-defining layer disposed between the plurality of pixels to define the plurality of pixels,
wherein the pixel-defining layer comprises:
a first pixel-defining layer disposed to at least partially cover the pixel electrode and comprising a negative photosensitive material and a black pigment; and
a second pixel-defining layer disposed on the first pixel-defining layer to at least partially cover the pixel electrode and comprising a positive photosensitive material and a black dye,
the first pixel-defining layer has an optical density of 1 or more, and
an optical density of the second pixel-defining layer is less than an optical density of the first pixel-defining layer.

15. The display device of claim 14, wherein a light transmittance of the first pixel-defining layer is substantially equal to or less than a light transmittance of the second pixel-defining layer.

* * * * *